United States Patent [19]
Arimoto

[11] Patent Number: 5,574,741
[45] Date of Patent: Nov. 12, 1996

[54] SEMICONDUCTOR LASER WITH SUPERLATTICE CLADDING LAYER

[75] Inventor: Satoshi Arimoto, Itami, Japan

[73] Assignee: Mitsubishi Denki Kabushiki Kaisha, Tokyo, Japan

[21] Appl. No.: 2,012

[22] Filed: Jan. 8, 1993

[30] Foreign Application Priority Data

Jul. 9, 1992 [JP] Japan ..................................... 4-207343

[51] Int. Cl.$^6$ ....................................................... H01S 3/19
[52] U.S. Cl. .................. 372/45; 372/44; 372/46
[58] Field of Search .................................. 372/45, 46, 50, 372/44, 47

[56] References Cited

U.S. PATENT DOCUMENTS

| | | | |
|---|---|---|---|
| 4,521,887 | 6/1985 | Liu et al. | 372/45 |
| 4,706,255 | 11/1987 | Thornton et al. | 372/46 X |
| 4,731,789 | 3/1988 | Thornton | 372/45 |
| 4,746,181 | 5/1988 | Hayakawa et al. | 385/131 |
| 4,750,183 | 6/1988 | Takahashi et al. | 372/45 |
| 4,802,182 | 1/1989 | Thornton et al. | 372/46 X |
| 4,817,103 | 3/1989 | Holonyak, Jr. et al. | 372/45 |
| 4,875,216 | 10/1989 | Thornton et al. | 372/46 X |
| 4,888,781 | 12/1989 | Omura et al. | 372/46 |
| 4,999,844 | 3/1991 | Imamoto | 372/45 |
| 5,018,158 | 5/1991 | Okada et al. | 372/46 |
| 5,151,913 | 9/1992 | Ueno | 372/46 |
| 5,181,086 | 1/1993 | Yoshida | 372/46 X |
| 5,272,712 | 12/1993 | Arimoto et al. | 372/45 |

FOREIGN PATENT DOCUMENTS 0014488  1/1987  Japan ....................................... 372/45

OTHER PUBLICATIONS

Murakami et al, "A Very Narrow–Beam AlGaAs Laser With A Thin Tapered–Thickness Active Layer (T$^3$ Laser)", IEEE Journal of Electronics, vol. QE–23, No. 6, Jun. 1987, pp. 712–719.

Suzuki et al, "Fabrication Of GaAlAs 'Window–Stripe' Multi–Quantum–Well Heterostructure Lasers Utilising Zn Diffusion–Induced Alloying", Electronics Letters, vol. 20, No. 9, Apr. 1984, pp. 383–384.

*Primary Examiner*—Rodney B. Bovernick
*Assistant Examiner*—Hemang Sanghavi
*Attorney, Agent, or Firm*—Leydig, Voit & Mayer

[57] ABSTRACT

A semiconductor laser device having a first conductivity type cladding layer, an active layer, and a second conductivity type cladding layer successively disposed on a first conductivity type substrate includes a superlattice semiconductor multi-layered structure disposed at least either between the active layer and the first conductivity type cladding layer or between the active layer and the second conductivity type cladding layer. The superlattice semiconductor multi-layered structure may include a multiquantum barrier and this multiquantum barrier may include a buffer layer for preventing tunneling disposed at the side of the active layer and a superlattice multi-layered film structure including plural barrier layers and plural well layers alternatingly laminated. As a result, light intensity at the laser facet is reduced, suppressing facet deterioration during high-power operation.

14 Claims, 9 Drawing Sheets

FIG. I(a)
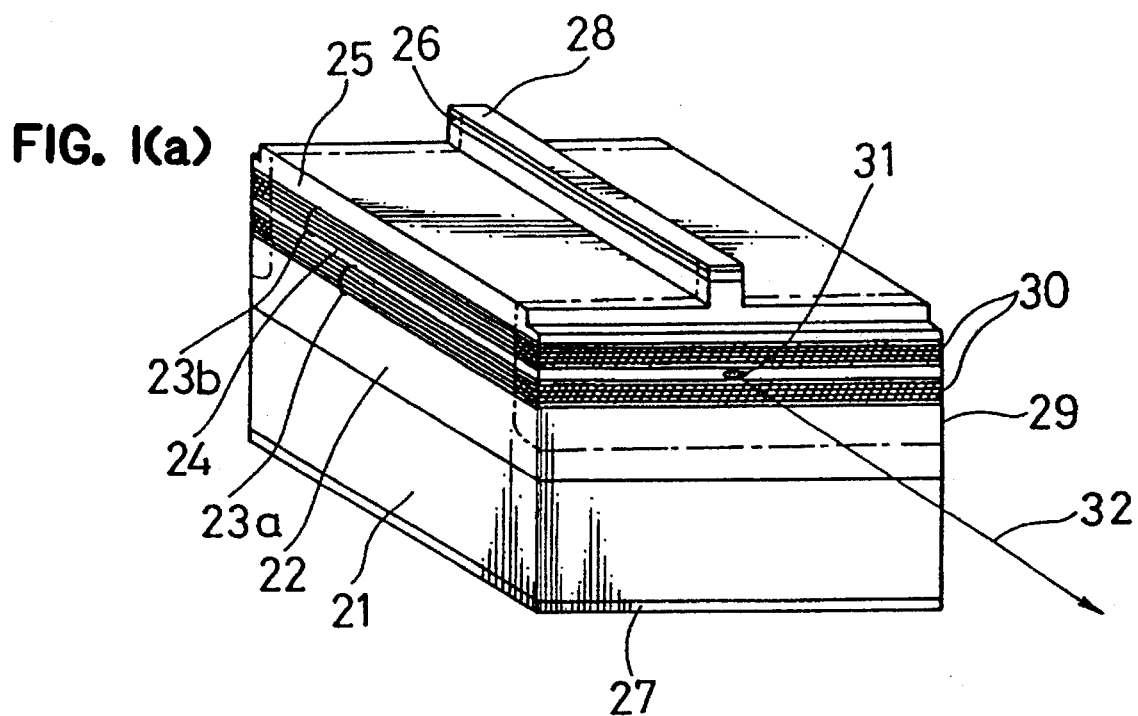
FIG. I(b)
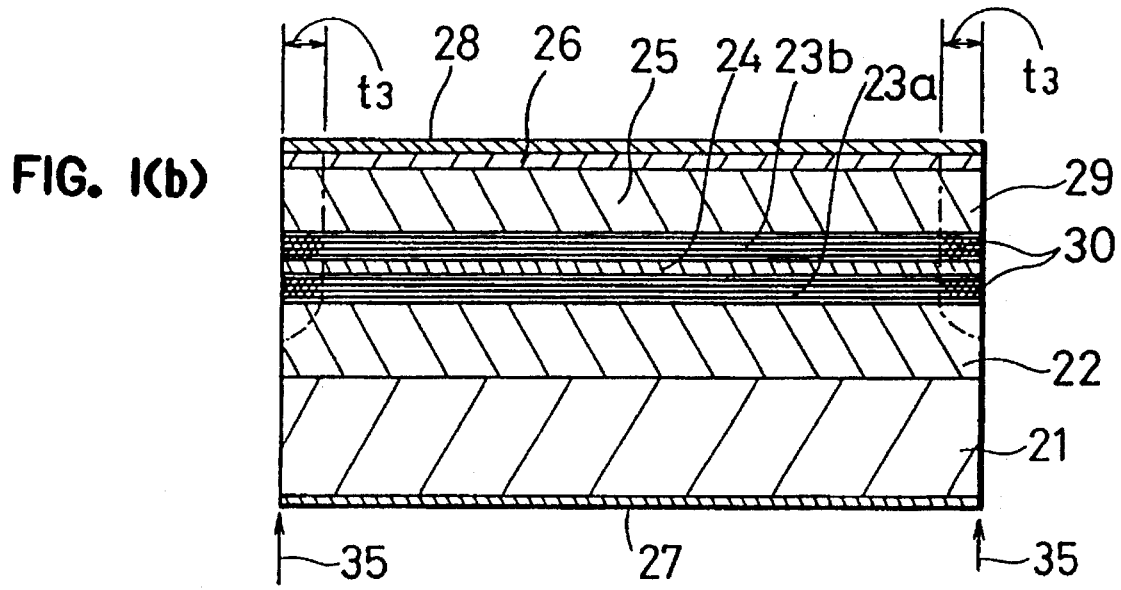

5,574,741

1

SEMICONDUCTOR LASER WITH SUPERLATTICE CLADDING LAYER

FIELD OF THE INVENTION

The present invention relates to a semiconductor laser device and, more particularly, to a high-power semiconductor laser device capable of suppressing facet deterioration in high-power operation.

BACKGROUND OF THE INVENTIONS

Generally, when a semiconductor laser is operated at a high power output, catastrophic optical damage (COD) occurs at an emitting facet of the laser and the laser is destroyed. This is caused by absorption by the laser facet part of the active layer of light generating heat thereby to decrease the energy band gap of that active layer part, which, in turn, again generates heat, resulting in repeating this operation. Therefore, many structures have been devised to prevent COD.

FIG. 6(a) is a perspective view, partially broken away, illustrating a prior art laser structure shown in "A Very Narrow-Beam AlGaAs Laser with a Thin Tapered-Thickness Active Layer ($T^3$ Laser)", IEEE J. Quantum Electron., Vol. QE-23, pp. 712–719 (1987) by T. Murakami, K. Ohtaki, H. Matsubara, T. Yamawaki, H. Saito, K. Isshiki, Y. Kokubo, A. Shima, H. Kumabe, and W. Susaki. This laser has a structure in which an active layer thickness in a laser facet region is different from an active layer thickness in an inner region, and which is called a thin tapered-thickness (hereinafter referred to as $T^3$) laser. In the Figure, on a surface of a p-type GaAs substrate 101 is formed a wide ridge 108 in the inner region of an element and narrow ridges 109 in the vicinity of the facets. An n-type GaAs current blocking layer 102 is disposed on the substrate 101 according to the configurations of the ridges produced on the substrate 101 so as to have also ridges 108 and 109 by itself. A striped V-groove 107 is formed extending in the resonator length direction in the center of the ridges 108 and 109 of the current blocking layer 102, and a bottom part of the V-groove 107 reaches the substrate 101. A p-type AlGaAs lower cladding layer 103 is disposed on the current blocking layer 102 and the V-groove 107, a p-type AlGaAs active layer 104 is disposed on the lower cladding layer 103, an n-type AlGaAs upper cladding layer 105 is disposed on the active layer 104 and an n-type GaAs contact layer 106 is disposed on the upper cladding layer 105. A p-side electrode 111 is disposed on the rear surface of the substrate 101 and an n-side electrode 112 is disposed on the surface of the contact layer 106. The feature of this prior art laser resides in that the laser includes the wide ridge 108 in the inner region, and the narrow ridges 109 in the vicinity of the laser facets and the active layer 104 on the ridges is thick on the wide ridge 108 and thin on the narrow ridges 109.

Next, a description is given of a production process of the $T^3$ laser with reference to FIGS. 7(a) to 7(c).

First, as illustrated in FIG. 7(a), by processing the p-type GaAs substrate 101 by etching or the like, the wide ridge 108 is formed in a portion corresponding to the inner region of the element and the narrow ridges 109 are formed in portions corresponding to the regions in the vicinity of the facets. As illustrated in FIG. 7(b), crystal growth is carried out by MOCVD (Metalorganic Chemical Vapor Deposition), to produce the n-type GaAs current blocking layer 102 on the substrate 101 on which these ridges are formed. Secondly, as illustrated in FIG. 7(c), the striped V-groove 107 is formed

2 extending in the resonator length direction in the center part of the current blocking layer 102 on the ridges 108 and 109 so that a bottom part of the V-groove 107 may reach to the substrate 101. Thereafter, crystal growth is carried out by LPE (liquid phase epitaxial growth), to produce successively the p-type $Al_{0.48}Ga_{0.52}As$ lower cladding layer 103, the p-type $Al_{0.15}Ga_{0.85}As$ active layer 104, the n-type $Al_{0.48}Ga_{0.52}As$ upper cladding layer 105 and the n-type GaAs contact layer 106, on the current blocking layer 102 and the V-groove 107. Here, when the layers 103 to 106 are successively laminated by LPE on a wafer of such configuration as illustrated in FIG. 7(c), namely, the wafer having a wide ridge part and narrow ridge parts and having the striped V-groove in the center thereof, the active layer 104 on the wide ridge 108 is thick and the active layer 104 on the narrow ridges 109 is thin. In FIG. 6(a), a $T^3$ structure 110 is shown as a structure in which the active layer has different thicknesses.

FIG. 6(b) is a side view of the $T^3$ structure 110. When the active layer 104 is grown, for example, the thickness t2 on the wide ridge part may be 700 to 800Å, the active layer thickness t1 on the narrow ridge part is approximately 300 to 350Å. In such a structure, since the active layer thickness on the laser facet is thin, confinement of laser beam in the active layer becomes weak and most of beam goes into the cladding layers 103 and 105. Thereby, optical density in the active layer at the laser facet is reduced and the COD level is increased. Here, the phenomenon that the active layer becomes thick on the wide ridge 108 and thin on the narrow ridges 109 is particular to the crystal growth performed by LPE, and cannot be realized by the MOVD method generally employed in GaAs wafer processing.

FIG. 8 is a perspective view showing another prior art laser structure described in ELECTRONICS LETTERS 26th April 1984 Vol.20 No.9, pp.383–384. This laser has window regions formed by disordering the vicinity of the facets of a multi-quantum-well (MQW) active layer. An n-type AlGaAs lower cladding layer 122 is disposed on an n-type GaAs substrate 121, a GaAs/AlGaAs MQW active layer 123 is disposed on the lower cladding layer 122, a p-type AlGaAs upper cladding layer 124 is disposed on the active layer 123 and a p-type GaAs cap layer 125 is disposed on the upper cladding layer 124. In the vicinity of both facets of the laser, Zn-diffused regions 128 reaching from the surface of the cap layer 125 to the lower cladding layer 122 are provided and the MQW in each Zn-diffused region 128 is a disordered region 129 which comprises AlGaAs of uniform composition due to mixed crystallization of GaAs and AlGaAs. The cap layer 125 and a portion of the upper cladding layer 124 are formed in a ridge shape. An n-side electrode 126 is disposed on the rear surface of the substrate 121 and a p-side electrode 127 is disposed on the surface of the cap layer 125. Reference numeral 150 designates a light emitting region and numeral 151 designates an emitted laser beam.

Next, a description is given of a production process of the window structure laser with reference to FIGS. 9(a) to 9(c).

First, as illustrated in FIG. 9(a), crystal growth is carried out by MBE (molecular beam epitaxy), to produce the n-type AlGaAs lower cladding layer 122, the GaAs/AlGaAs MQW active layer 123, the p-type AlGaAs upper cladding layer 124 and the p-type GaAs cap layer 125, on the n-type GaAs substrate 121. Secondly, a $Si_3N_4$ film 130 is formed on a wafer and apertures are formed in the vicinity of regions which become the laser facets in a later cleavage process, by patterning the $Si_3N_4$ film 130. As illustrated in FIG. 9(b), Zn 135 is diffused into the wafer through the apertures of the Si$_3$N$_4$ film 130. As a diffusion method, either a vapor phase diffusion or a solid phase diffusion may be employed. Then, the diffusion is carried out at least until the diffusion front reaches the lower cladding layer 122 through the active layer 123. As a result, the MQW active layer 123 in the Zn-diffused region 128 becomes the disordered region 129 which comprises AlGaAs of uniform composition due to mixed crystallization of a GaAs well layer and an AlGaAs barrier layer. After then removing the Si$_3$N$_4$ film 130, the p-side electrode 127 is formed on the cap layer 125 and the n-side electrode 126 is formed on the rear surface of the substrate 121. After etching the cap layer 125 and a portion of the upper cladding layer 124 to a desired shape, cleavage is conducted as illustrated in FIG. 9(c), to form the laser facets and to divide the wafer into chips, resulting in a completed laser as shown in FIG. 8.

In the semiconductor laser shown in FIG. 8, the vicinity of the facet in the active layer of the MQW structure is disordered by impurity diffusion and the disordered region 129 comprises AlGaAs having an energy band gap larger than that of a GaAs well layer. Therefore, a beam Generated in a portion where the MQW active layer is not disordered is not absorbed in the disordered region 129 and optical density in the vicinity of the facet is reduced, resulting in an increase in the COD level.

The semiconductor laser shown in FIGS. 6(a) and 6(b), has, as described above, controlled crystal layer thicknesses determined depending on the crystal growth mechanism inherent to the liquid phase growth, thereby reducing the optical density at the laser facet. However, there are problems in the liquid phase growth method, in that, a larger area substrate cannot be employed, it is inferior in mass production, and the crystal layer thickness is difficult to control.

In the semiconductor laser device shown in FIG. 8, in which the window structure is formed by disordering the vicinity of the facets of the MQW active layer, because a quantum-well active layer is employed for the active layer, the oscillation wavelength of the semiconductor laser is difficult to control. FIG. 10 is a diagram showing a relation between a well layer thickness (well width) and a photoluminescence wavelength equivalent to the oscillation wavelength of the active layer, in a single quantum well (SQW) active layer comprising a well layer of Al$_{0.1}$Ga$_{0.9}$As sandwiched by barrier layers of Al$_{0.42}$Ga$_{0.58}$As. As is apparent from the Figure, the oscillation wavelength is difficult to control because the wavelength shift relative to the well width is large at a well width less than 100Å.

SUMMARY OF THE INVENTION

It is an object of the present invention to provide a semiconductor laser device that has high productivity, that can suppress laser facet deterioration with a simple structure, and that can control the oscillation wavelength, easily.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

A semiconductor laser device in accordance with the present invention includes superlattice semiconductor multi-layered structures between an active layer comprising a single layer and an upper and a lower cladding layer, respectively, and the superlattice semiconductor multi-layered structures in the vicinity of the laser facet are disordered by impurity diffusion or the like. As a result, the radius of the laser beam at the facets is enlarged, thereby to reduce the optical density at the laser facet, while the oscillation wavelength can be easily controlled because a single layer structure is employed for the active layer.

BRIEF DESCRIPTION OF THE DRAWINGS

FIGS. 1(a) and 1(b) are diagrams illustrating a semiconductor laser device in accordance with a first embodiment of the present invention.

DETAILED DESCRIPTION OF THE PREFERRED EMBODIMENT

Figure 2A:
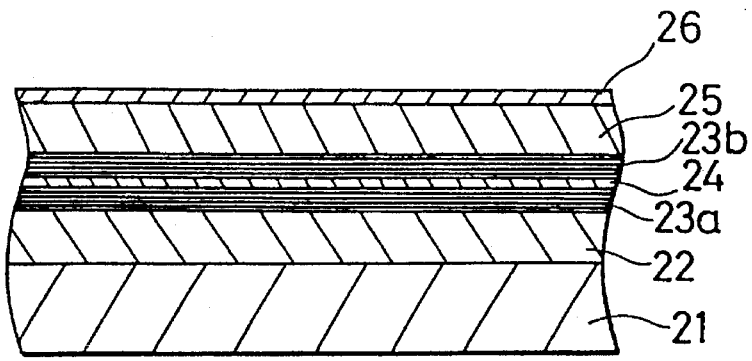
FIGS. 2(a) to 2(d) are sectional views showing process steps in a method of producing the semiconductor laser device of FIG. 1.

Embodiments of the present invention will be described in detail with reference to the drawings.

FIG. 1(a) is a perspective view showing a semiconductor laser device in accordance with a first embodiment of the present invention. In the figure, an n-type Al$_{0.48}$Ga$_{0.52}$As lower cladding layer 22 is disposed on an n-type GaAs substrate 21, a first superlattice multi-layered film structure 23a comprising a plurality of Al$_{0.48}$Ga$_{0.52}$As barrier layers and Al$_{0.15}$Ga$_{0.85}$As well layers is disposed on the lower cladding layer 22, a single Al$_{0.15}$Ga$_{0.85}$As active layer 24 is disposed on the first superlattice multi-layered structure 23a and a second superlattice multi-layered film structure 23b comprising a plurality of Al$_{0.48}$Ga$_{0.52}$As barrier layers and Al$_{0.15}$Ga$_{0.85}$As well layers is disposed on the active layer 24. Further, a p-type Al$_{0.48}$Ga$_{0.52}$As upper cladding layer 25 is disposed on the second superlattice multi-layered structure 23b and a p-type GaAs cap layer 26 is disposed on the upper cladding layer 25. In the vicinity of both facets of the laser, Zn-diffused regions 29 reaching from the surface of the cap layer 26 to the lower cladding layer 22 are disposed, and the superlattice multi-layered films 23a and 23b in the Zn-diffused regions 29 are disordered regions 30 which comprise AlGaAs of uniform composition due to mixed crystallization of AlGaAs of different compositions. The cap layer 26 and a portion of the upper cladding layer 25 are formed in a ridge shape. An n-side electrode 27 is disposed on the rear surface of the substrate 21 and a p-side electrode 28 is disposed on the surface of the cap layer 26. Reference numeral 31 designates an emitting region and numeral 32 designates an emitted light beam. FIG. 1(b) is a sectional view showing the device of FIG. 1(a) taken along the resonator length direction. The width t3 of each Zn-diffused region from a laser facet 35 illustrated in the Figure is 10 to 50 microns.

A description is given of a method for producing the semiconductor laser device of FIGS. 1(a) and 1(b). FIGS. 2(a) to 2(d) are sectional views illustrating process steps therein.

First, as illustrated in FIG. 2(a), on the n-type GaAs substrate 21, epitaxial growth is carried out by MOCVD or MBE having improved thin film thickness controllability, to produce successively the n-type $Al_{0.48}Ga_{0.52}As$ lower cladding layer 22 of 1.5 microns thickness, the first superlattice multi-layered film structure 23a comprising a plurality of $Al_{0.48}Ga_{0.52}As$ barrier layers of 50Å thickness and $Al_{0.15}Ga_{0.85}As$ well layers of 50Å thickness, the single $Al_{0.15}Ga_{0.85}As$ active layer 24 of 300Å thickness, the second superlattice multi-layered film structure 23b having the same structure as the first superlattice multi-layered film structure 23a, the p-type $Al_{0.48}Ga_{0.52}As$ upper cladding layer 25 of 1.5 microns thickness and the p-type GaAs cap layer 26.

Figure 2B:
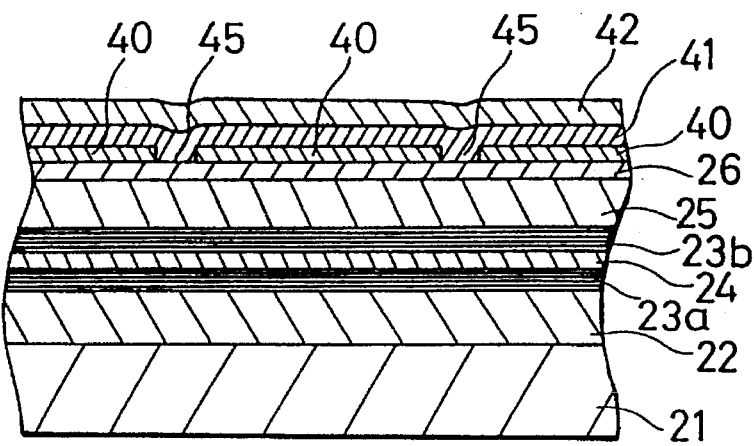
Figure 2C:
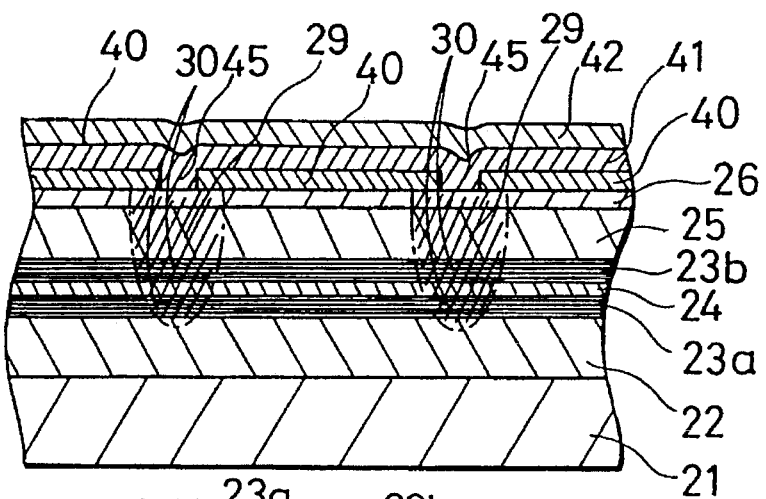
Figure 2D:
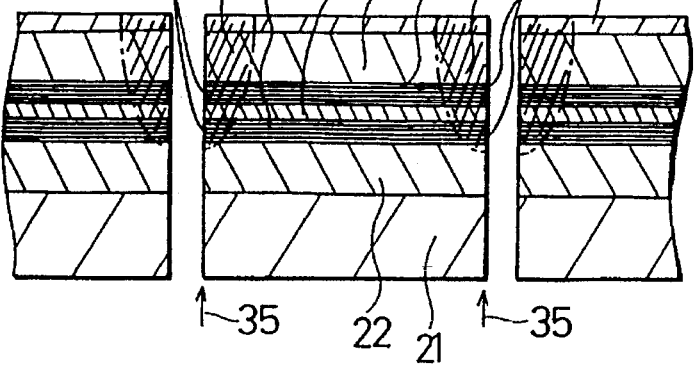

Secondly, a $Si_3N_4$ film 40 is formed on the cap layer 26 and apertures 45 are formed in the vicinity of regions which become the laser facets in a later cleavage process, by patterning the $Si_3N_4$ film 40. Then, as illustrated in FIG. 2(b), a mixed film 41 comprising ZnO and $SiO_2$ and a protecting film 42 for preventing impurities from dispersing into the ambient are successively laminated on the wafer on which the $Si_3N_4$ film 40 pattern is formed. By carrying out annealing in such state illustrated in FIG. 2(b), Zn is diffused into the wafer from the mixed film 41 and, as illustrated in FIG. 2(c), the Zn-diffused regions 29 reaching from the surface of the cap layer 26 to the lower cladding layer 22 are formed. The disordered regions 30 are formed due to mixed crystallization of the superlattice multi-layered films 23a and 23b by impurities (Zn) diffused at this time. Further, as a method of impurity diffusion, vapor phase diffusion of Zn as well as solid phase diffusion of Zn may be employed. In addition, as an impurity, Si may be employed in place of Zn. Further, in place of diffusion, ion implantation of dopant impurities may be employed to result in the same effect. Thereafter, as illustrated in FIG. 2(d), cleavage is conducted to form the laser facets 35 as well as to divide the wafer into chips, resulting in the completed laser shown in FIG. 1(a).

Figure 3A:
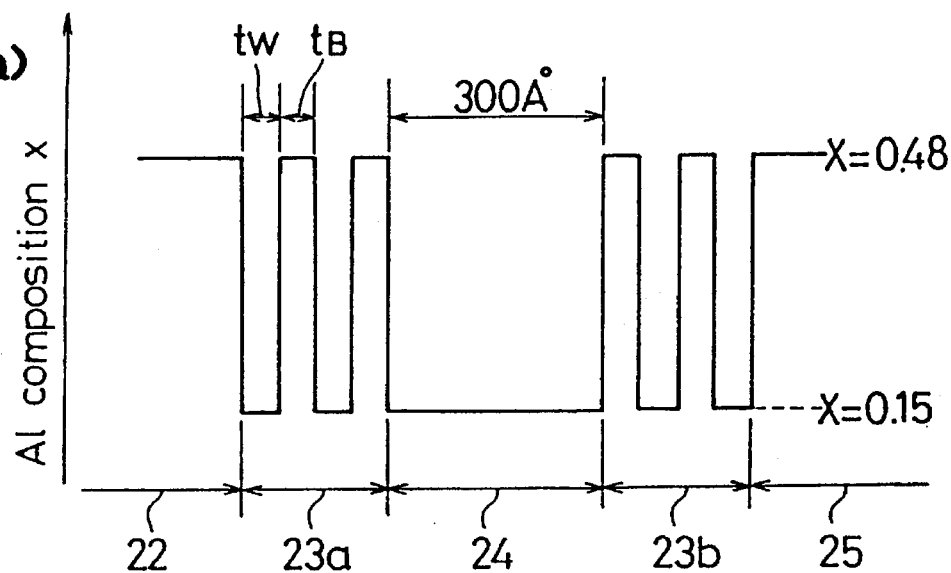
FIGS. 3(a) and 3(b) are schematic diagrams illustrating changes in composition when a mixed crystallization is carried out by impurity diffusion.
Figure 3B:
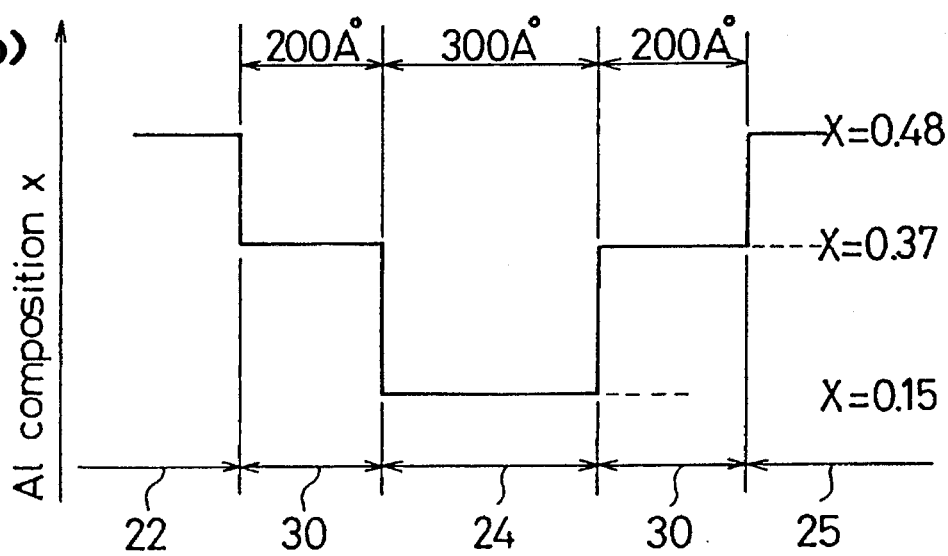

A description is given of the operation and effect of the semiconductor laser device in accordance with this embodiment with reference to FIGS. 3(a) and 3(b).

Figure 6A:
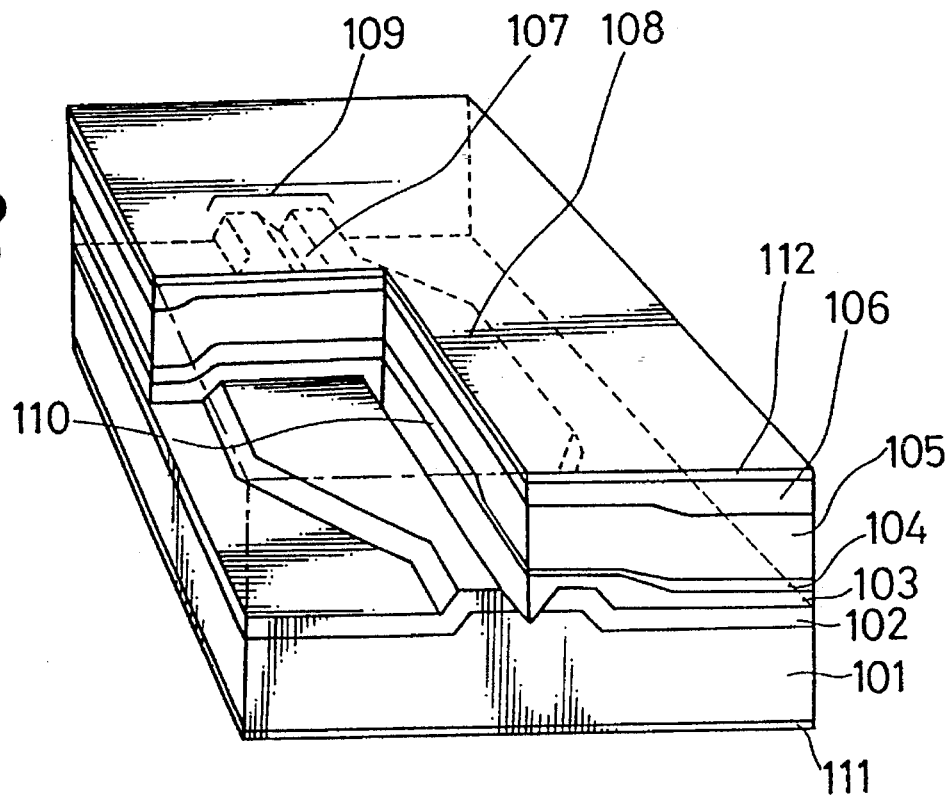
FIGS. 6(a) and 6(b) are schematic diagrams illustrating a prior art semiconductor laser device.
Figure 6B:
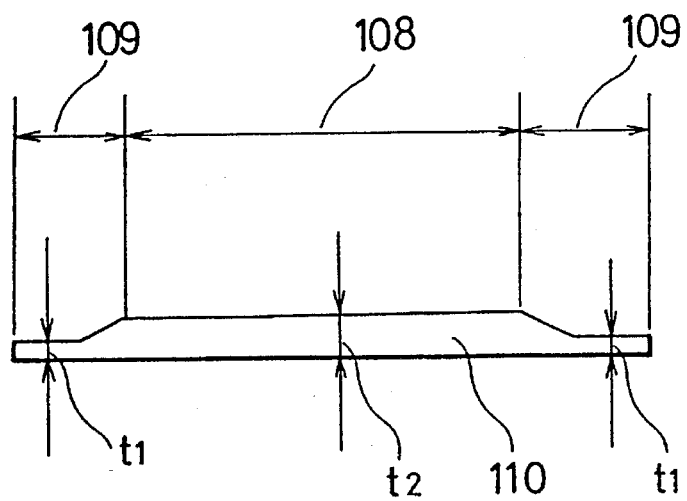
Figure 7A:
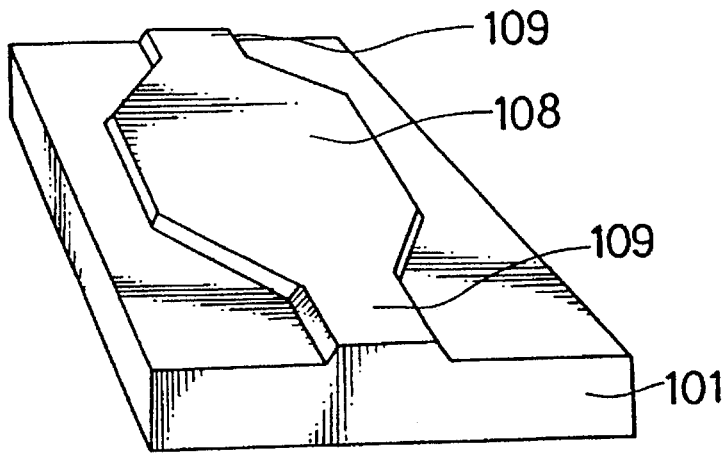
FIGS. 7(a) to 7(c) are perspective views illustrating a method of producing the semiconductor laser device of FIGS. 6(a) and 6(b).
Figure 7B:
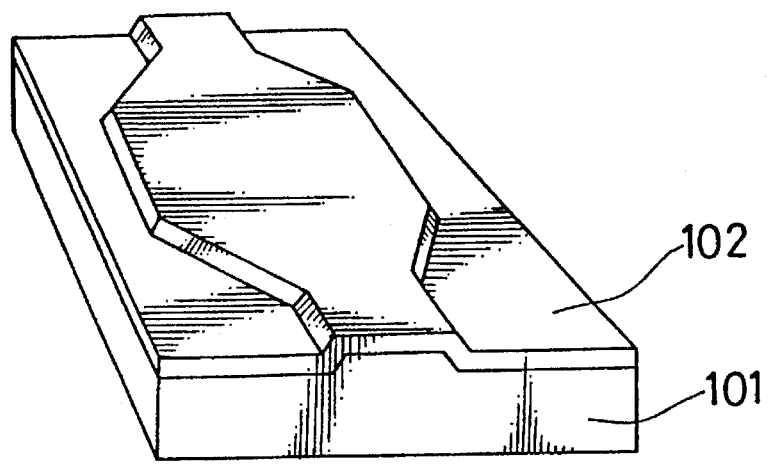
Figure 7C:
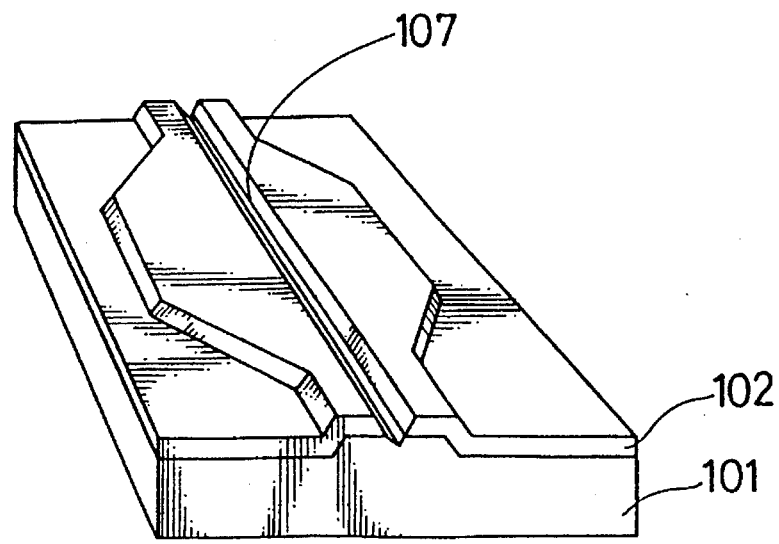

FIGS. 3(a) and 3(b) are schematic diagrams respectively illustrating Al composition ratio before and after impurities are diffused, when, in the semiconductor laser device of FIG. 1(a), the superlattice multi-layered film structure 23a (23b) has a structure comprising two $Al_{0.48}Ga_{0.52}As$ layers of 50Å thickness and two $Al_{0.15}Ga_{0.85}As$ layers of 50Å thickness alternatingly laminated and the active layer 24 comprising $Al_{0.15}Ga_{0.85}As$ is 300Å thick. As shown in FIG. 3(b), the Al composition of the superlattice multi-layered structure mixture crystallized by impurity diffusion is 0.37. In the structures of FIGS. 3(a) and 3(b), for obtaining oscillation wavelength of 0.78 microns, suppose that light confinement coefficient of the active layer 24 is $\Gamma$ and the angle of the laser beam broadening in the direction perpendicular to the active layer 24 is $\theta\perp$, $\Gamma$ is 0.0817 and $\theta\perp$ is 27.4 deg in the structure of FIG. 3(a) and $\Gamma$ is 0.0689 and $\theta\perp$ is 25.0 deg in the structure of FIG. 3(b). This means that the amount of light entering the upper and lower cladding layers at the laser facet increases when the structure of FIG. 3(b) is employed for the laser facet. In other words, the optical density at the laser facet is reduced, resulting in suppressing COD in the high-power laser similarly as in the prior art device of FIGS. 6(a) and 6(b). While the prior art laser structure of FIGS. 6(a) and 6(b) is obtained only by liquid phase growth, in accordance with this embodiment, the laser structure can be produced by employing a crystal growth such as MOCVD method, which can realize improved mass production, resulting in improved reproducibility and lowered cost.

Figure 8:
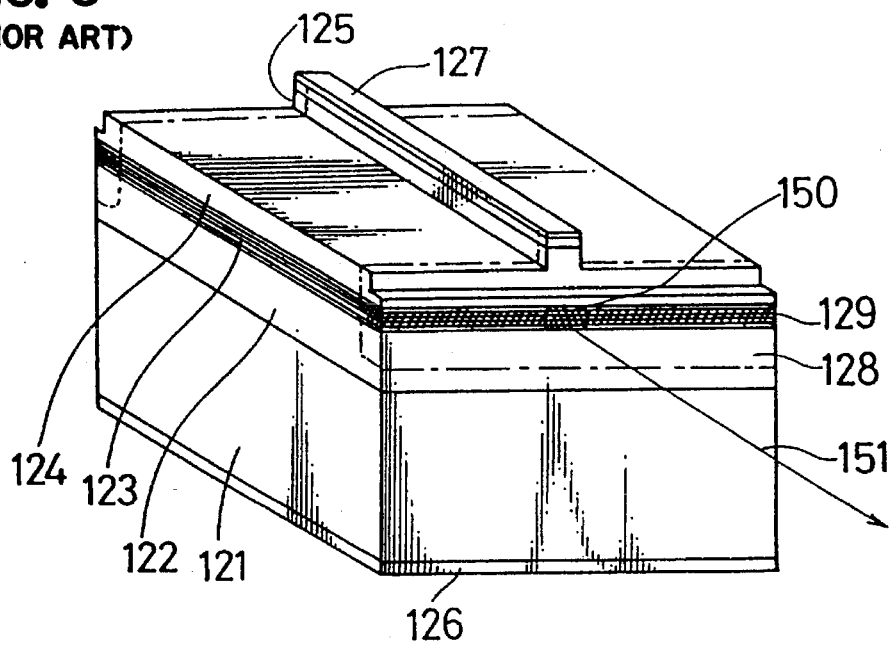
FIG. 8 is a perspective view illustrating another prior art semiconductor laser device.
Figure 9A:
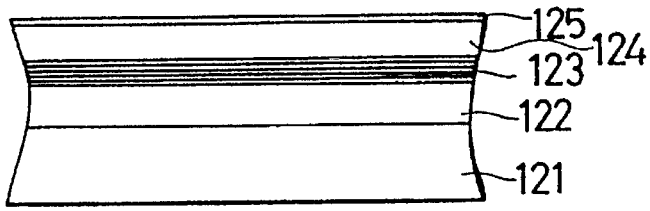
FIGS. 9(a) to 9(c) are sectional views illustrating a method for producing the semiconductor laser device of FIG. 8.
Figure 9B:
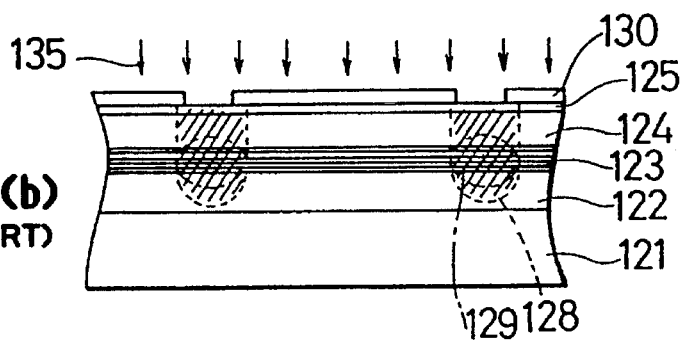
Figure 9C:
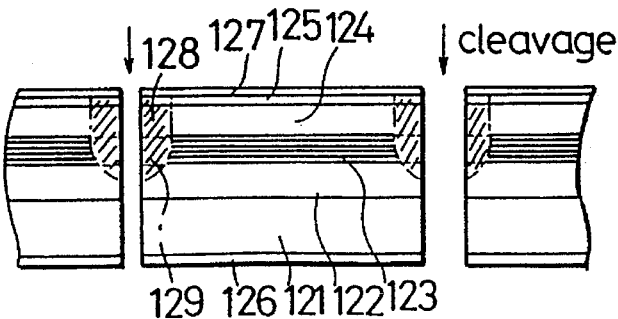
Figure 10:
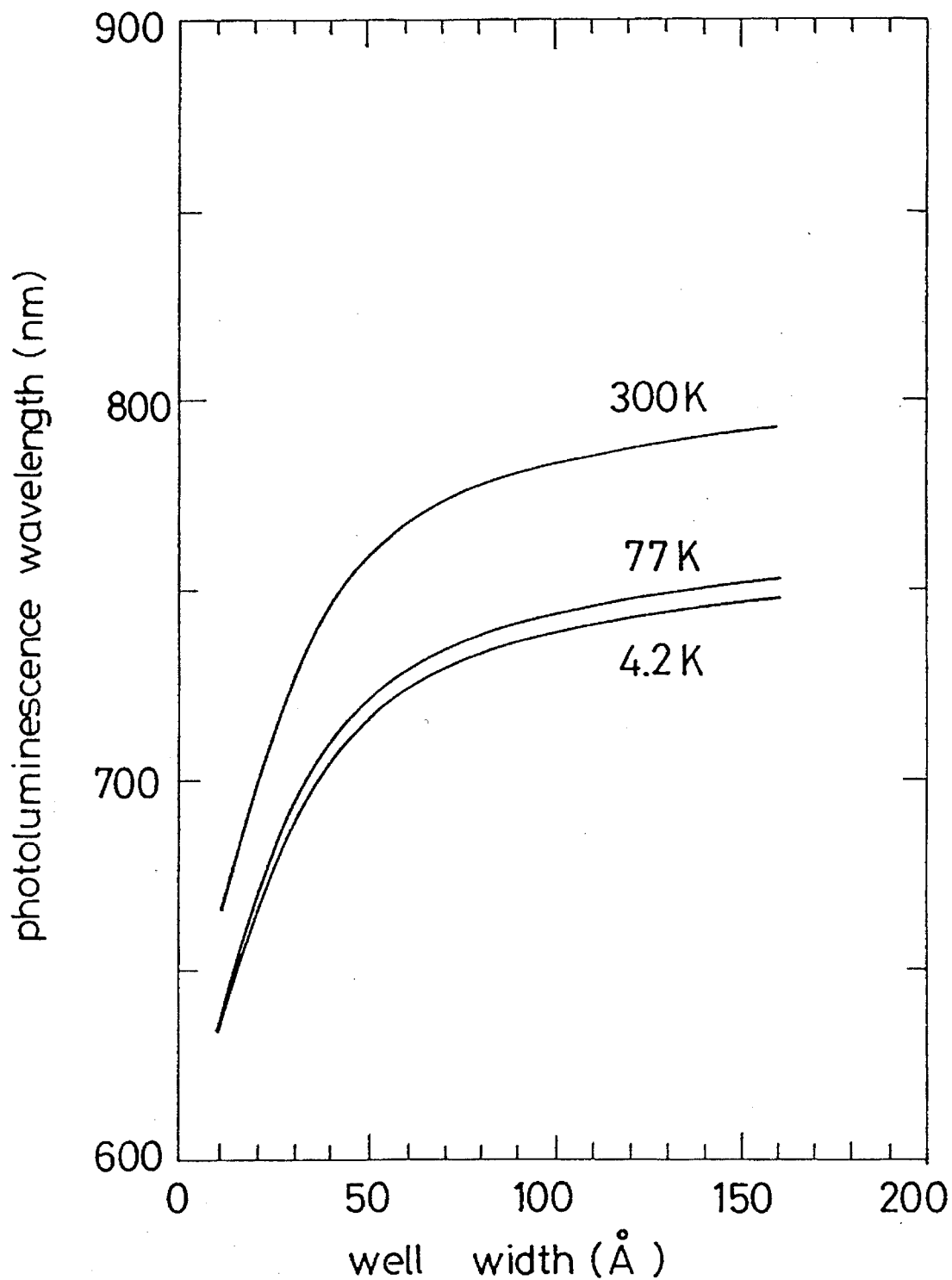
FIG. 10 is a diagram for illustrating a problem of the semiconductor laser device of FIG. 8.

In the prior art having the window structure of FIG. 8, the active layer is required to be a quantum well structure to realize a window structure which results in unfavorable variation in well layer thickness in the producing process and significantly affects oscillation wavelength. On the contrary, in this embodiment, since the active layer comprises not a quantum well structure but a single layer relatively thick structure, variation in the active layer thickness in the producing process has less effect on oscillation wavelength. In other words, this embodiment has an advantage in that the oscillation wavelength is controlled much more easily than the prior art device of FIG. 8. Further, while the superlattice multi-layered structures are arranged so as to sandwich the active layer in the above-described embodiment, the superlattice multi-layered structure may be arranged only at either the upper or lower side of the active layer, with the same or a little less effect due to less light confinement due to the smaller disordered region than in the above-described embodiment.

While in the above-described first embodiment the superlattice multi-layered film structure 23a (23b) has a structure in which the well layers and barrier layers of approximately 50Å are laminated, the same effects are expected in the laser device employing a multiquantum barrier (MQB) as the superlattice multi-layered structure.

Figure 4A:
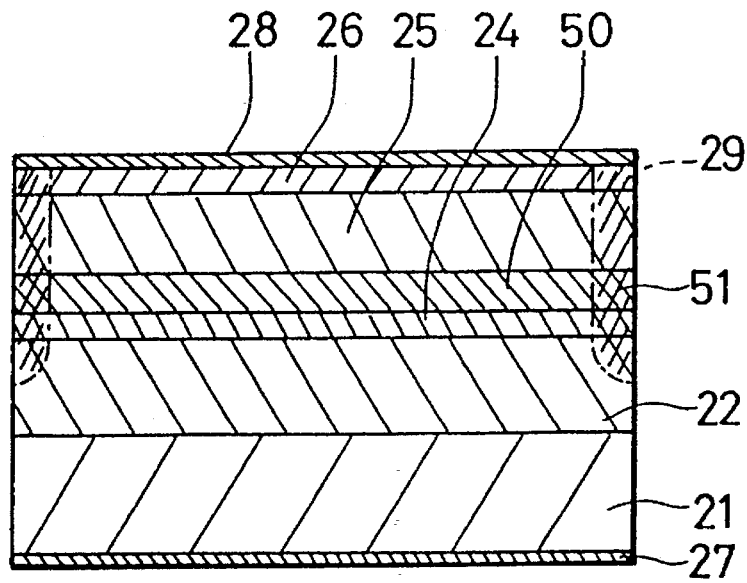
FIGS. 4(a) to 4(c) are schematic diagrams illustrating a semiconductor laser device in accordance with a second embodiment of the present invention.
Figure 4B:
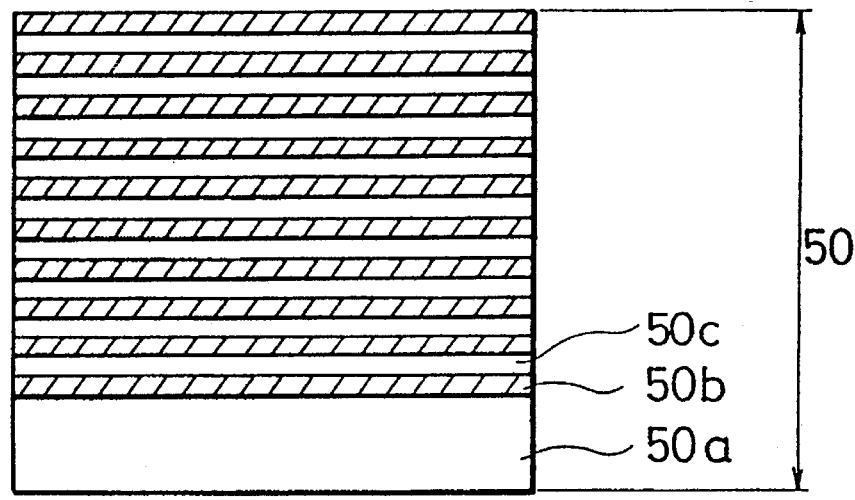

FIG. 4(a) is a sectional view illustrating a semiconductor laser device employing the MQB as the superlattice multi-layered film structure in accordance with a second embodiment of the present invention. In the Figure, the same reference numerals as those of FIGS. 1(a) and 1(b) designate the same or corresponding parts. An MQB 50 is arranged between the active layer 24 and the upper cladding layer 25. As illustrated in FIG. 4(b), the MQB 50 comprises a p-type $Al_{0.48}Ga_{0.52}As$ buffer layer 50a of approximately 200Å thickness disposed on the active layer 24, p-type $Al_{0.15}Ga_{0.85}As$ well layers 50b and p-type $Al_{0.48}Ga_{0.52}As$ barrier layers 50c respectively having a thickness of more than 10 and less than 20 Angstroms which are alternately laminated several times on the buffer layer 50a. In the vicinity of both facets of the laser, as in the first embodiment, the Zn-diffused regions 29 reaching from the surface of the cap layer 26 to the lower cladding layer 22, and the MQBs 50 in the Zn-diffused regions 29 are disordered regions 51 which comprise AlGaAs of uniform composition due to mixture crystallization of AlGaAs of different compositions. The MQB comprises the buffer layer 50a of around 200Å thickness and a superlattice multi-layered film comprising the well layers 50b and the barrier layers 50c having a thickness of more than 10 and less than 20 Angstroms. In the superlattice multi-layered film structure having such a layer thickness, the electron confinement effect into the active layer can be increased because electrons are reflected at the interface between the active layer 24 and the MQB 50.

The enhanced electron confinement effect in the active layer due to the MQB will be described in more detail.

Figure 4C:
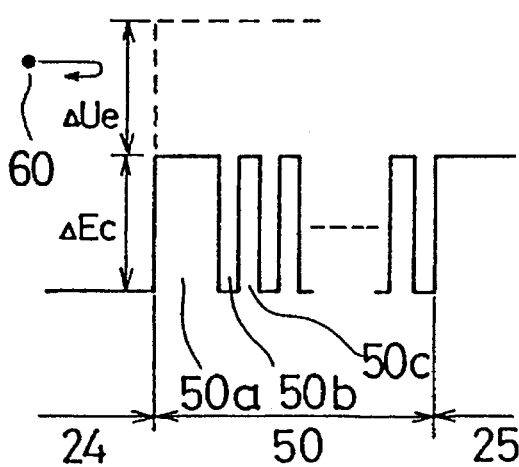

FIG. 4(c) is a schematic diagram illustrating the operation of the semiconductor laser device including the MQB between the active layer and the cladding layer. In the figure, reference character ΔEc is the difference in the conduction band edge energy between the active layer 24 and the cladding layer 25, and character ΔUe shows an increased effective potential barrier due to a quantum mechanical effect of the MQB. As shown in FIG. 4(c), in the structure in which the MQB 50 is arranged between the active layer 24 and the cladding layer 25, the height of the effective potential barrier is increased due to the quantum mechanical effect of the MQB. Therefore, even electrons 60 having an energy larger than ΔEc, among the electrons injected into the active layer 24, are reflected by the effective potential barrier formed by the MQB, and are confined effectively into the active layer 24. As a result, in the semiconductor laser device employing the MQB between the active layer and the cladding layer, due to the above-described effects of suppressing an overflow carriers, enhancement of characteristics such as lowering of the threshold current can be obtained. Here, an effective increase in the potential barrier is obtained due to a superlattice multi-layered structure comprising the well layers 50b and the barrier layers 50c. In a case where only this superlattice multi-layered structure is provided, since mini-bands are produced in the wells of the superlattice multi-layered structure, electrons having an energy smaller than ΔEc can pass through to the cladding layer side by tunneling. So, in this embodiment, the buffer layer 50a is provided to constitute a superlattice multi-layered structure with the superlattice multi-layered films, so as to prevent such passing, namely, tunneling of electrons having an energy smaller than ΔEc, through the superlattice multi-layered film structure proper.

In the semiconductor laser device in accordance with the second embodiment, the regions in the vicinity of both laser facets of the MQB 50, comprising the buffer layer 50a, the well layers 50b and the barrier layers 50c, are disordered regions 51, comprising AlGaAs of uniform composition, by being disordered by impurity diffusion or the like. As a result, similarly as in the first embodiment, light confinement becomes weak and the optical density is reduced, increasing the COD level. Further, while the MQB is arranged between the active layer 24 and the p-type upper cladding layer 25 in this second embodiment, an MQB can be arranged on either side of the active layer 24 or one MQB can be arranged between the active layer 24 and the n-type lower cladding layer 22 and another MQB can be arranged between the active layer 24 and the p-type upper cladding layer 25.

Figure 5A:
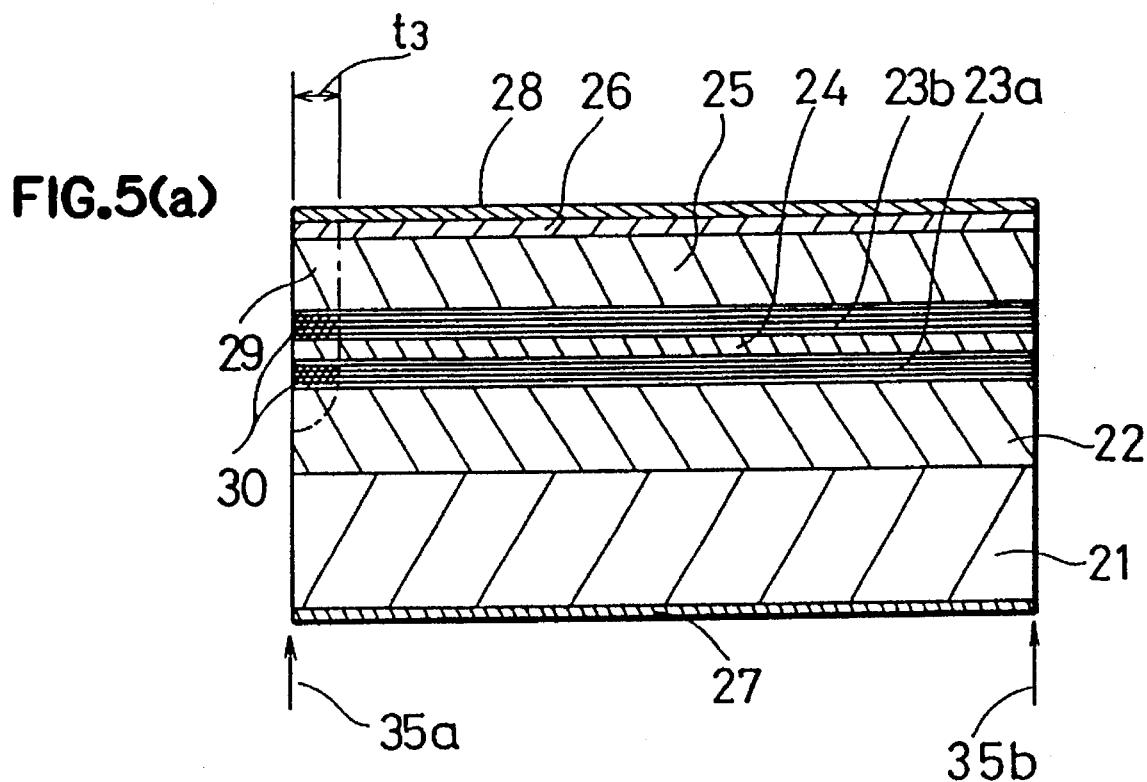
FIGS. 5(a) and 5(b) are schematic diagrams illustrating a semiconductor laser device in accordance with a third embodiment of the present invention.

While the disordered regions of the superlattice multi-layered structure are formed at the both facets of the laser in the first and the second embodiments, in a semiconductor laser having a front facet of a different facet refractive index from the rear facet thereof, it is not necessarily required to dispose the disordered regions at both facets of the laser. FIG. 5(a) is a schematic diagram illustrating a semiconductor laser having the disordered region at only one facet in accordance with a third embodiment of the present invention. In the figure, the same reference numerals as those of FIGS. 1(a) and 1(b) designate the same or corresponding parts. Reference numeral 35a designates a laser front facet to which a low refractive index coating is applied, and numeral 35b designates a laser rear facet to which a high refractive index coating is applied.

Figure 5B:
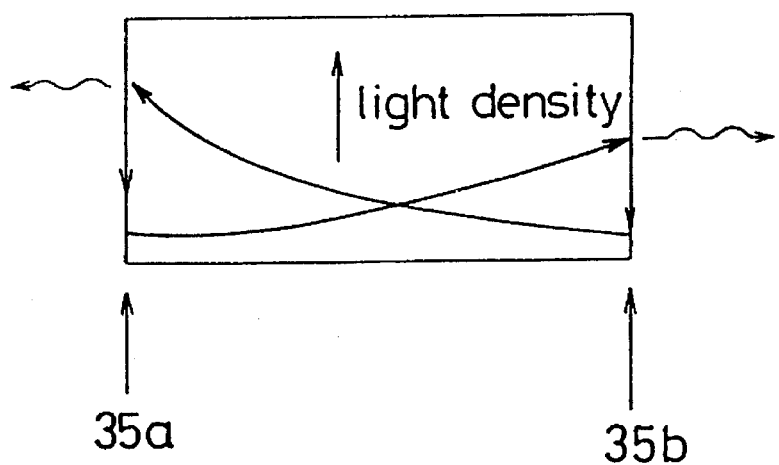

FIG. 5(b) is a schematic diagram showing distributions of the optical density at the front and the rear facets with different facet refractive indices in the semiconductor laser. As shown in the figure, the optical density in the vicinity of the laser rear facet 35b, to which a high refractive index coating is applied, is lower than that in the vicinity of the laser front end 35a, to which a low refractive index coating is applied. In such semiconductor laser, since the COD seldom occurs at the laser rear facet 35b, as shown in FIG. 5(a), the disordered region 30 is disposed only at the laser front facet 35a at which the optical density is high, increasing the COD level.

While AlGaAs system materials are employed in the first to the third embodiments, a semiconductor laser can be constructed by employing other III–V group semiconductors and II–VI group semiconductors, for example, AlGaInP, InGaAsP or the like, in accordance with the present invention.

As described above, a semiconductor laser device in accordance with the present invention, includes a superlattice semiconductor multi-layered structure between an active layer and a cladding layer and the superlattice semiconductor multi-layered structure in the vicinity of the laser facet is disordered by impurity diffusion or the like. As a result, optical density at the laser facet is reduced, suppressing facet deterioration in high-power operation.

What is claimed is:

1. A semiconductor laser device comprising:

a first conductivity type substrate;

a first conductivity type cladding layer disposed on said first conductivity type substrate;

an active layer consisting of a single layer disposed on said first conductivity type cladding layer;

a second conductivity type cladding layer disposed on said active layer, the semiconductor laser having opposed facets transverse to said active layer for reflecting and transmitting light; and a semiconductor superlattice structure disposed between and contacting said active layer and said second conductivity type cladding layer, said superlattice structure being disordered at at least one of the facets.

2. The semiconductor laser device of claim 1 wherein said superlattice structure comprises a plurality of alternating barrier layers and well layers.

3. The semiconductor laser device of claim 2 wherein said first conductivity type cladding layer comprises $Al_xGa_{1-x}As$, said active layer remote from the facets consists of $Al_yGa_{1-y}As$ ($0 \leq y < x$), said second conductivity type cladding layer comprises $Al_zGa_{1-z}As$ ($y<z$), said first conductivity type substrate comprises GaAs, said barrier layers comprise $Al_pGa_{1-p}As$, and said well layers comprise $Al_qGa_{1-q}As$ ($0 \leq q < p$).

4. A semiconductor laser device of claim 1 comprising a second semiconductor superlattice structure disposed between and contacting said active layer and said first conductivity type cladding layer, said second superlattice structure being disordered at at least one of the facets.

5. A semiconductor laser device comprising:

a first conductivity type substrate;

a first conductivity type cladding layer disposed on said first conductivity type substrate;

an active layer consisting of a single layer disposed on said first conductivity type cladding layer;

a second conductivity type cladding layer disposed on said active layer, the semiconductor laser having opposed facets transverse to said active layer for reflecting and transmitting light; and a semiconductor superlattice structure disposed between and contacting said active layer and said first conductivity type cladding layer, said superlattice structure being disordered at at least one of the facets.

6. The semiconductor laser device of claim 5 wherein said superlattice structure comprises a plurality of alternating barrier layers and well layers.

7. The semiconductor laser device of claim 6 wherein said first conductivity type cladding layer comprises $Al_xGa_{1-x}As$, said active layer remote from the facets consists of $Al_yGa_{1-y}As$ ($0 \leq y < x$), said second conductivity type cladding layer comprises $Al_zGa_{1-z}As$ ($y < z$), said first conductivity type substrate comprises GaAs, said barrier layers comprise $Al_pGa_{1-p}As$, and said well layers comprise $Al_qGa_{1-q}As$ ($0 \leq q < p$).

8. A semiconductor laser device comprising:
 a first conductivity type substrate;
 a first conductivity type cladding layer disposed on said first conductivity type substrate;
 an active layer consisting of a single layer disposed on said first conductivity type cladding layer;
 a second conductivity type cladding layer disposed on said active layer, the semiconductor laser having opposed facets transverse to said active layer for reflecting and transmitting light; and
 a semiconductor multiquantum barrier structure comprising a superlattice structure and a buffer layer disposed between said active layer and said second conductivity type cladding layer with said buffer layer contacting said active layer and said superlattice structure contacting said second conductivity type cladding layer, said buffer layer preventing tunneling of charge carriers from said active layer into said second conductivity type cladding layer, said superlattice structure being disordered at at least one of the facets.

9. The semiconductor laser device of claim 8 wherein said superlattice structure comprises a plurality of alternating barrier layers and well layers and said buffer layer is thicker than said barrier and well layers for preventing tunneling of charge carriers.

10. The semiconductor laser device of claim 9 wherein said first conductivity type cladding layer comprises $Al_xGa_{1-x}As$, said active layer remote from the facets consists of $Al_yGa_{1-y}As$ ($0 \leq y < x$), said second conductivity type cladding layer comprises $Al_zGa_{1-z}As$ ($y < z$), said first conductivity type substrate comprises GaAs, said buffer layer comprises AlGaAs, said barrier layers comprise $Al_pGa_{1-p}As$, and said well layers comprise $Al_qGa_{1-q}As$ ($0 \leq q < p$).

11. A semiconductor laser device of claim 8 comprising a second semiconductor multiquantum barrier structure comprising a second superlattice structure and a second buffer layer disposed between said active layer and said first conductivity type cladding layer with said second buffer layer contacting said active layer and said second superlattice structure contacting said first conductivity type cladding layer, said second superlattice structure being disordered at at least one of the facets.

12. A semiconductor laser device comprising:
 a first conductivity type substrate;
 a first conductivity type cladding layer disposed on said first conductivity type substrate;
 an active layer consisting of a single layer disposed on said first conductivity type cladding layer;
 a first conductivity type cladding layer disposed on said active layer, the semiconductor laser having opposed facets transverse to said active layer for reflecting and transmitting light; and
 a semiconductor multiquantum barrier structure comprising a superlattice structure and a buffer layer disposed between said active layer and said first conductivity type cladding layer with said buffer layer contacting said active layer and said superlattice structure contacting said first conductivity type cladding layer, said buffer layer preventing tunneling of charge carriers from said active layer into said first conductivity type cladding layer, said superlattice structure being disordered at at least one of the facets.

13. The semiconductor laser device of claim 12 wherein said superlattice structure comprises a plurality of alternating barrier layers and well layers and said buffer layer is thicker than said barrier and well layers for preventing tunneling of charge carriers.

14. The semiconductor laser device of claim 13 wherein said first conductivity type cladding layer comprises $Al_xGa_{1-x}As$, said active layer remote from the facets consists of $Al_yGa_{1-y}As$ ($0 \leq y < x$), said second conductivity type cladding layer comprises $Al_zGa_{1-z}As$ ($y < z$), said first conductivity type substrate comprises GaAs, said buffer layer comprises AlGaAs, said barrier layers comprise $Al_pGa_{1-p}As$, and said well layers comprise $Al_qGa_{1-q}As$ ($0 \leq q < p$).

* * * * *